(12) United States Patent
Angermann et al.

(10) Patent No.: US 6,613,616 B2
(45) Date of Patent: Sep. 2, 2003

(54) METHOD FOR FABRICATING FIELD-EFFECT TRANSISTORS IN INTEGRATED SEMICONDUCTOR CIRCUITS AND INTEGRATED SEMICONDUCTOR CIRCUIT FABRICATED WITH A FIELD-EFFECT TRANSISTOR OF THIS TYPE INCLUDING A DUAL GATE

(75) Inventors: Wolfgang Angermann, Seeshaupt (DE); Andreas Bänisch, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/951,241

(22) Filed: Sep. 12, 2001

(65) Prior Publication Data

US 2002/0037639 A1 Mar. 28, 2002

(30) Foreign Application Priority Data

Sep. 12, 2000 (DE) .......................... 100 45 045

(51) Int. Cl.⁷ .................. H01L 21/00; H01L 21/84; H01L 21/336; H01L 21/3203; H01L 21/4763
(52) U.S. Cl. .................. 438/157; 438/283; 438/301; 438/589

(58) Field of Search ................. 438/157, 283, 438/301, 589

(56) References Cited

U.S. PATENT DOCUMENTS

| 5,338,959 A | 8/1994 | Kim et al. |
| 5,646,058 A | 7/1997 | Taur et al. |
| 5,705,405 A | * 1/1998 | Cunningham |

FOREIGN PATENT DOCUMENTS

| DE | 44 33 086 C2 | 6/1996 |
| DE | 198 03 479 A1 | 12/1998 |
| DE | 199 28 564 A1 | 1/2001 |
| JP | 361185972 A | * 9/1986 |

* cited by examiner

Primary Examiner—John F. Niebling
Assistant Examiner—Ron E. Pompey
(74) Attorney, Agent, or Firm—Laurence A. Greenberg; Werner H. Stemer; Ralph E. Locher

(57) ABSTRACT

A method for fabricating a field-effect transistor situated within an integrated semiconductor circuit. At least two gate regions each extending between a source region and a drain region and are disposed such that they lie one above the other in a thickness direction of a substrate, thereby reducing the space requirement of the hitherto customary larger field-effect transistors in integrated semiconductor circuits.

4 Claims, 2 Drawing Sheets

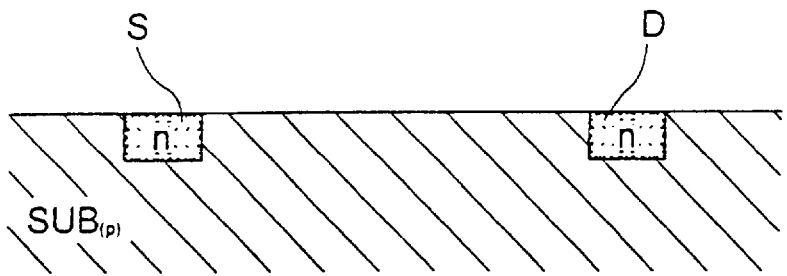
Fig. 1A
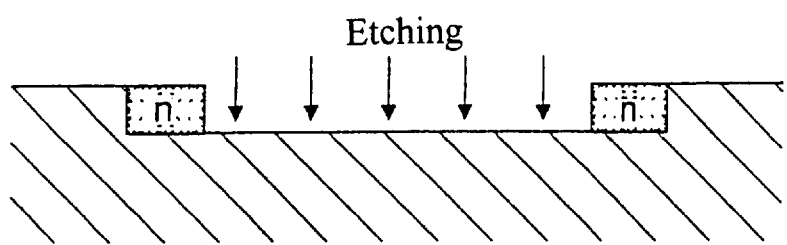
Fig. 1B
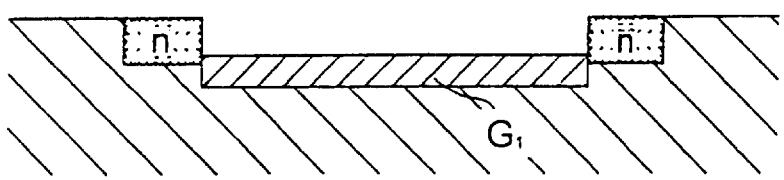
Fig. 1C
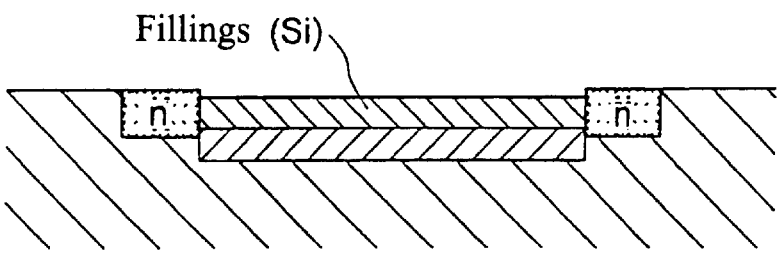
Fig. 1D
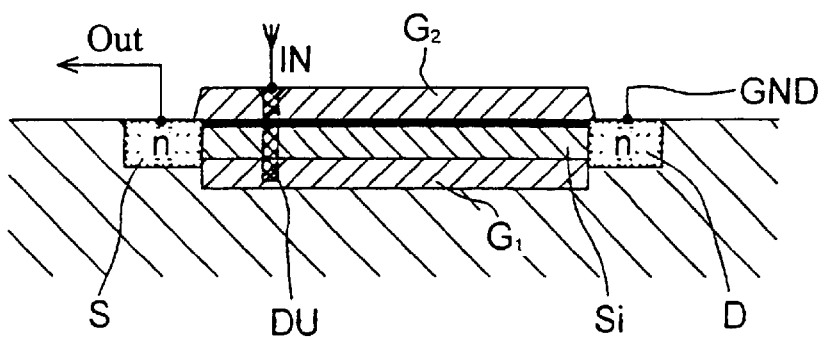
Fig. 1E
Fig. 1

METHOD FOR FABRICATING FIELD-EFFECT TRANSISTORS IN INTEGRATED SEMICONDUCTOR CIRCUITS AND INTEGRATED SEMICONDUCTOR CIRCUIT FABRICATED WITH A FIELD-EFFECT TRANSISTOR OF THIS TYPE INCLUDING A DUAL GATE

BACKGROUND OF THE INVENTION

Field of the Invention

The invention relates to a method for fabricating field-effect transistors, in particular MOS transistors, in integrated semiconductor circuits, in which mutually spaced-apart source and drain regions of a first conductivity type are produced in a semiconductor substrate of an opposite conductivity type. A plurality of strip-type gate regions are produced in each case between mutually assigned adjacent source and drain regions, and the gate regions respectively associated with a field-effect transistor are interconnected. The invention likewise relates to a field-effect transistor that is provided within an integrated semiconductor circuit and has at least two gate regions that in each case extend between a source region and a drain region in or on a substrate and are interconnected by an electrical connection. Furthermore, the invention relates to an integrated semiconductor circuit having at least one field-effect transistor of this type.

MOS field-effect transistors are very often used for driver transistors in integrated semiconductor circuits. Larger field-effect transistors of this type, i.e. higher-power field-effect transistors, have hitherto been fabricated in such a way that a plurality of parallel gate strips are disposed in finger form in/on a substrate between respectively assigned source and drain regions. In this case, such a field-effect transistor configured for a higher power could easily have a lateral dimension measuring ten times its width dimension, which is e.g. 50 $\mu$m, the lateral dimension measuring e.g. 500 $\mu$m.

In the course of large scale integration of integrated semiconductor circuits, such a large area of the driver transistors is unacceptable and a method is desired for reducing the space requirements of such driver transistors.

Consequently, it is an object of the invention to realize, in an integrated semiconductor circuit, larger field-effect transistors, i.e. higher-power field-effect transistors, with a reduced space requirement.

SUMMARY OF THE INVENTION

It is accordingly an object of the invention to provide a method for fabricating field-effect transistors in integrated semiconductor circuits and an integrated semiconductor circuit fabricated with a field-effect transistor of this type that overcomes the above-mentioned disadvantages of the prior art methods of this general type, in which a higher-power field effect transistor with a reduced space requirement is produced.

With the foregoing and other objects in view there is provided, in accordance with the invention, a method for fabricating a field-effect transistor in an integrated semiconductor circuit. The method includes producing mutually spaced-apart source and drain regions of a first conductivity type in or on a semiconductor substrate of a second conductivity type opposite the first conductivity type. A section of a main area of the semiconductor substrate is etched-out between the source and drain regions resulting in an etched substrate section. A first gate region is formed in the etched substrate section, with a result that the first gate region lies between the source and drain regions. A semiconductor material is deposited above the first gate region in the etched substrate section. At least one second gate region is produced above the first gate region with an interposition of the semiconductor material. The first gate region is connected to the second gate region on at least one side free of the source and drain regions with an electrically conductive material. The source and drain regions being common to the first gate region and the second gate region lying one above the other.

In order to achieve the object, the invention proposes a generic method for fabricating field-effect transistors, in particular MOS transistors, in integrated semiconductor circuits, which is characterized in that the plurality of gate regions respectively associated with a field-effect transistor are disposed in layers one above the other in and/or on the substrate in the thickness direction thereof. In other words, the way into the third dimension is taken instead of extending the transistor in the plane of the main area of the integrated semiconductor circuit. Situated between the gate regions disposed one above the other there is in each case a semiconductor layer, in particular a silicon layer, and a source region on one side of the gate regions and a drain region on the other side are common to all the gate regions lying one above the other. A fabrication method of this type can be implemented using process steps that are known in detail. First, a section is etched out within a substrate section, defining a field-effect transistor, in each case between a source region and an associated drain region from a main area of the substrate. Afterward, a first gate region is produced in the substrate within the etched section, with the result that the first gate region lies between the two associated source and drain regions. Afterward, the first gate region within the etched substrate section is covered with a semiconductor material, e.g. silicon. Finally, a second gate region is formed above the first gate region, i.e. above that region of the same which is covered by the semiconductor material. It goes without saying that not only two but more than two gate regions can be disposed one above the other in this way. To that end, the depth of the mutually associated source and drain regions and the etching depth in between must be correspondingly greater in the thickness direction of the substrate. The assigned gate regions are subsequently conductively connected to one another.

Preferably, a field-effect transistor fabricated in this way is a MOS transistor, the substrate region defining the transistor is a p-doped silicon substrate region, and the drain and source regions are composed of n-type silicon.

The gate regions lying one above the other can be connected in a simple manner on at least one side thereof which is free of the drain and source region by a readily electrically conductive material.

The above features according to the invention show that a field-effect transistor according to the invention not only has the advantage of the reduced space requirement on the semiconductor chip but also saves electrical contacts, since there is only one source region and one drain region, so that there is no need to connect mutually associated source regions or drain regions to one another, as have been necessary hitherto in the prior art.

The space saving through a field-effect transistor realized by the method according to the invention in an integrated semiconductor circuit is greater, the more gate regions that are disposed such that they lie one above the other.

Other features which are considered as characteristic for the invention are set forth in the appended claims.

Although the invention is illustrated and described herein as embodied in a method for fabricating field-effect transistors in integrated semiconductor circuits and an integrated semiconductor circuit fabricated with a field-effect transistor of this type, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1A to FIG. 1E are diagrammatic, cross-sectional views through an integrated semiconductor showing process steps for fabricating a field-effect transistor according to the invention;

DESCRIPTION OF THE PREFERRED EMBODIMENTS

Figure 2:
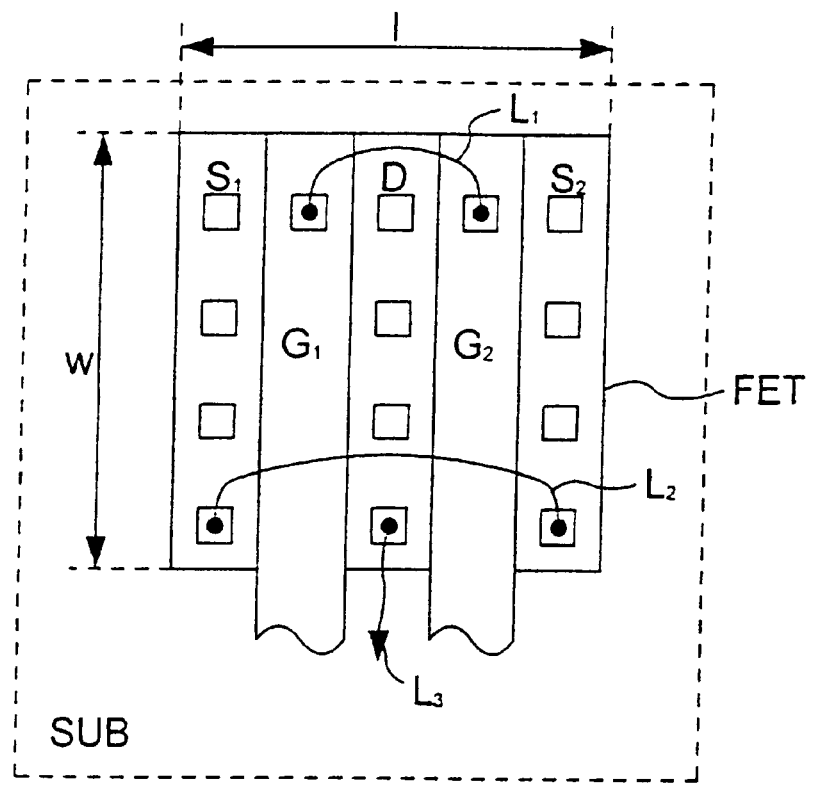
FIG. 2 is a diagrammatic, planar plan view, of a substrate region with the field-effect transistor that has been customary hitherto in integrated semiconductor circuits and has two parallel strip-type gate fingers.

In all the figures of the drawing, sub-features and integral parts that correspond to one another bear the same reference symbol in each case. Referring now to the figures of the drawing in detail and first, particularly, to FIG. 1 thereof, there is shown an exemplary embodiment of a fabrication method according to the invention and a field-effect transistor according to the invention, fabricated by the method. A construction example of a larger field-effect transistor that has been customary hitherto in integrated semiconductor circuits is described with reference to FIGS. 2 and 3.

In FIG. 2, a field-effect transistor FET can be discerned in a p-conducting substrate section SUB indicated by broken lines. In the substrate SUB, two parallel gate fingers G1, G2 are in each case situated between a first source region S1, a drain region D and a second source region S2. The two parallel gate fingers G1 and G2 are electrically connected to one another by a first connecting line L1 e.g. by bonding a wire line on corresponding contact pads. In the same way, the two source regions S1 and S2 are electrically connected to one another by a second connecting line L2. An output line L3 is connected to a central drain region. For technological reasons, a width w of the field-effect transistor of this type is e.g. less than or equal to 50 μm.

Even larger field-effect transistors, i.e. higher-power field-effect transistors, with more than two gate fingers can also be fabricated in the manner illustrated in FIG. 2. Such a field-effect transistor having e.g. ten parallel gate fingers can have a length dimension l that amounts to e.g. 500 μm, i.e. ten times the width w.

Figure 3:
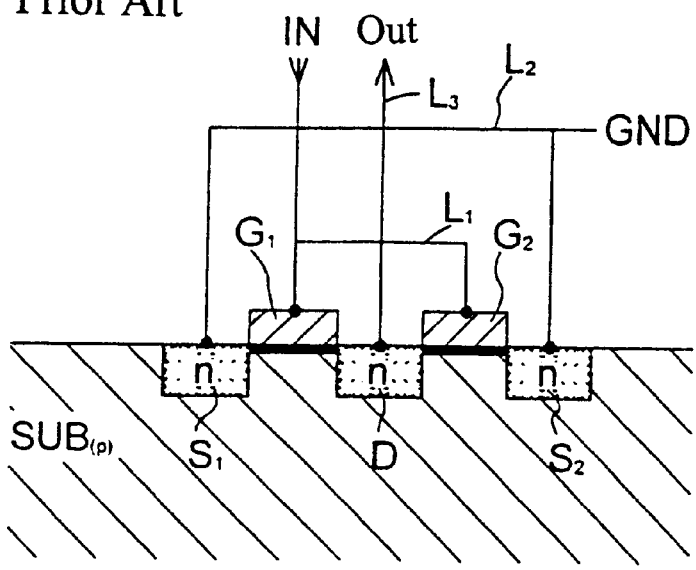
FIG. 3 is a diagrammatic, cross-sectional view of the conventional field-effect transistor shown in FIG. 2.

FIG. 3 shows, in cross section, the known field-effect transistor that is illustrated in the planar plan view in FIG. 2 and is described above. The source regions S1, S2 and the drain region D form n-doped semiconductor regions in the p-conducting substrate SUB. The gate fingers G1 and G2 are in each case situated between the source and drain regions S1, S2 and D. The electrical connecting lines L1, L2 between the two gate fingers G1 and G2 and between the two source regions S1 and S2 can likewise be seen in FIG. 3. An input signal IN can be fed to the gate fingers G1 and G2 and an output signal OUT can be taken from the drain region D.

The method according to the invention for fabricating a larger field-effect transistor in an integrated semiconductor circuit is now described with reference to FIG. 1, which method reduces the above-mentioned elevated space requirement in the integrated semiconductor circuit. The basic concept of the invention consists in a process step sequence through which the gate regions G1, G2 are not placed next to one another, but rather one above the other, i.e. in a thickness direction of the substrate SUB.

In accordance with FIG. 1A, first an n-doped source region S and the n-doped drain region D are formed in the p-conducting substrate SUB. As will become clearer below, the distance between the source region S and the drain region D corresponds to a length dimension of the entire field-effect transistor. Afterward, in accordance with FIG. 1B, the region situated between source region S and the drain region D is etched as far as a depth which allows a plurality of gate regions to be placed one above the other in such a way that they share the one source region S and the one drain region D. In accordance with FIG. 1C, the first gate region G1 is subsequently introduced into that region of the substrate SUB that has been etched out by the etching in accordance with FIG. 1B. Afterward, the first gate region G1 is covered with a silicon layer Si in accordance with FIG. 1D. On the silicon layer S1, the second gate region G2 is then formed, in accordance with FIG. 1E, in such a way that it is located between the source region S and the drain region D, i.e. directly above the first gate region G1. The two gate regions G1 and G2 lying one above the other are subsequently electrically connected to one another e.g. by a plated-through hole DU. In addition, a line feeding the input signal IN can be provided on the plated-through hole. An output line OUT can be contact-connected on the source region S and a ground line GND can be contact-connected on the drain region D.

Although the exemplary embodiment—described above and illustrated in FIGS. 1A–1E—of the fabrication method according to the invention for the larger field-effect transistor in the integrated semiconductor circuit only describes two gate regions G1 and G2 lying one above the other, it is immediately clear to the person skilled in the art that it is also possible to realize more than two gate regions simply by repeating the steps in accordance with FIGS. 1C to 1E and a corresponding depth of the etching in accordance with FIG. 1B.

Disposing a plurality of gate regions of a field-effect transistor in a manner lying one above the other makes it possible to save a great deal of space (chip area) in comparison with the hitherto customary fabrication method, to be precise all the more, the more gate regions are placed one above the other.

Each of the process steps described above can be realized by procedures that are customary in the fabrication of integrated semiconductor circuits.

A field-effect transistor fabricated by the above-described method illustrated in FIGS. 1A–1E may be e.g. a MOS field-effect transistor, which, like hitherto customary field-effect transistors, has a rectangular form. Instead of the plated-through hole DU which establishes the electrical connection between the gate regions G1 and G2 and is shown in FIG. 1E, other contact-making methods can also connect one or both sides—free of the source region S and drain region D—of the gate regions to one another.

We claim:

1. A method for fabricating a field-effect transistor in an integrated semiconductor circuit, which comprises the steps of:

producing mutually spaced-apart source and drain regions of a first conductivity type one of in a semiconductor substrate of a second conductivity type opposite the first conductivity type;

etching-out a section of a main area of the semiconductor substrate between the source and drain regions resulting in an etched substrate section;

forming a first gate region in the etched substrate section, with a result that the first gate region lies between the source and drain regions;

depositing a semiconductor material above the first gate region in the etched substrate section;

producing at least one second gate region above the first gate region with an interposition of the semiconductor material; and connecting the first gate region to the second gate region on at least one side free of the source and drain regions with an electrically conductive material, the source and drain regions being common to the first gate region and the second gate region lying one above the other.

2. The method according to claim 1, which comprises:

forming the section of the semiconductor substrate containing the field-effect transistor as a p-doped silicon substrate section;

forming the drain and source regions from n-type silicon; and forming the first gate region and the second gate region from $SiO_2$.

3. The method according to claim 1, which comprises forming the field-effect transistor as a metal-oxide semiconductor transistor.

4. A method for fabricating field-effect transistors in an integrated semiconductor circuit, which comprises the steps of:

producing mutually spaced-apart source and drain regions of a first conductivity type one of in a semiconductor substrate of a second conductivity type opposite said first conductivity type;

etching-out sections of a main area of the semiconductor substrate between respective source and drain regions resulting in etched substrate sections;

forming a first gate region in each of the etched substrate sections, with a result that the first gate region lies between a respective source region and a respective drain region;

depositing a semiconductor material above the first gate region in each of the etched substrate sections;

producing at least one second gate region above the first gate region in each of the sections with an interposition of the semiconductor material; and connecting the first gate region to the second gate region on at least one side free of the respective source region and the respective drain region with an electrically conductive material, the respective source region and the respective drain region being common to the first gate region and the second gate region lying one above the other.

* * * * *